United States Patent
Matsuzaki et al.

(10) Patent No.: US 12,446,357 B2
(45) Date of Patent: Oct. 14, 2025

(54) METHOD FOR MANUFACTURING NITRIDE SEMICONDUCTOR LIGHT-EMITTING ELEMENT

(71) Applicant: NIKKISO CO., LTD., Tokyo (JP)

(72) Inventors: Miho Matsuzaki, Hakusan (JP); Yusuke Matsukura, Hakusan (JP); Cyril Pernot, Hakusan (JP)

(73) Assignee: Nikkiso Co., Ltd., Tokyo (JP)

( * ) Notice: Subject to any disclaimer, the term of this patent is extended or adjusted under 35 U.S.C. 154(b) by 457 days.

(21) Appl. No.: 18/157,868

(22) Filed: Jan. 23, 2023

(65) Prior Publication Data
US 2023/0238475 A1 Jul. 27, 2023

(30) Foreign Application Priority Data
Jan. 25, 2022 (JP) .................................. 2022-009154

(51) Int. Cl.
*H10H 20/01* (2025.01)
*H10H 20/819* (2025.01)
*H10H 20/825* (2025.01)

(52) U.S. Cl.
CPC ...... *H10H 20/0137* (2025.01); *H10H 20/819* (2025.01); *H10H 20/8252* (2025.01)

(58) Field of Classification Search
CPC ............ H10H 20/0137; H10H 20/819; H10H 20/8252; H10H 20/816; H10H 20/01335; H10H 20/812
See application file for complete search history.

(56) References Cited

U.S. PATENT DOCUMENTS

2021/0043802 A1* 2/2021 Matsukura ........... H10H 20/824

FOREIGN PATENT DOCUMENTS

| JP | 2001-196702 A | 7/2001 |
| JP | 2012-248625 A | 12/2012 |
| JP | 2017-028076 A | 2/2017 |

OTHER PUBLICATIONS

Official Action dated Feb. 7, 2023 issued in related JP 2022-009154 together with English language translation.
Official Action dated Jun. 13, 2023 issued in related JP 2022-009154 together with English language translation.

\* cited by examiner

*Primary Examiner* — Mohammad A Rahman
(74) *Attorney, Agent, or Firm* — Scully, Scott, Murphy & Presser, PC

(57) ABSTRACT

A method for manufacturing a nitride semiconductor light-emitting element includes growing a p-type cladding layer with an average Al composition ratio in a thickness direction of not less than 70%, and growing a p-type contact layer with an Al composition ratio of not more than 10%. A flow rate ratio $F_p/F_{III}$ is a p/III ratio and a flow rate ratio $F_V/F_{III}$ is a V/III ratio. The p-type cladding layer is grown in the growing the p-type cladding layer at a growth rate of not more than 2.5 nm/min, a p/III ratio of not less than 0.0002 and not more than 0.0400 and a V/III ratio of not more than 7000. The p-type contact layer is grown in the growing the p-type contact layer at a growth rate of not more than 3.3 nm/min, a p/III ratio of not less than 0.0200 and a V/III ratio of not less than 10000.

12 Claims, 1 Drawing Sheet

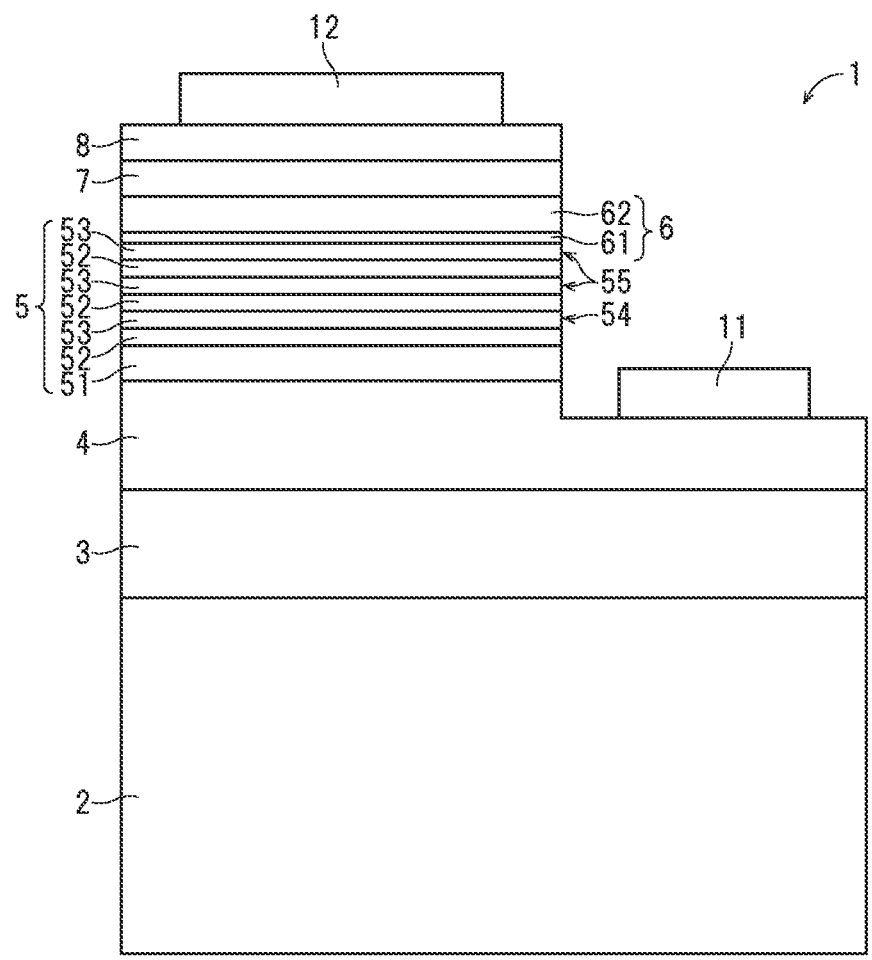

METHOD FOR MANUFACTURING NITRIDE SEMICONDUCTOR LIGHT-EMITTING ELEMENT

CROSS-REFERENCE TO RELATED APPLICATIONS

The present patent application claims the priority of Japanese patent application No. 2022/009154 filed on Jan. 25, 2022, and the entire contents of Japanese patent application No. 2022/009154 are hereby incorporated by reference.

TECHNICAL FIELD

The present invention relates to a method for manufacturing a nitride semiconductor light-emitting element.

BACKGROUND ART

Patent Literature 1 discloses a method for manufacturing a nitride semiconductor light-emitting element that includes a p-type cladding layer made of p-type AlGaN with an Al composition ratio of not less than 50% and a p-type contact layer (p-type cap layer) made of p-type GaN and formed on the p-type cladding layer. In the method for manufacturing a nitride semiconductor light-emitting element described in Patent Literature 1, manufacturing conditions such as a growth rate of the p-type contact layer and a flow rate ratio of various source gases to form the p-type contact layer are devised to flatten the surface of the p-type contact layer.

CITATION LIST

Patent Literature

Patent Literature 1: JP 2012/248625 A

SUMMARY OF INVENTION

However, the surface condition of the p-type contact layer varies depending on the configuration and conditions for forming the p-type cladding layer. Therefore, in the method for manufacturing a nitride semiconductor light-emitting element described in Patent Literature 1, there is room for improvement in terms of flattening the surface of the p-type contact layer.

The invention was made in view of such circumstances and it is an object of the invention to provide a method for manufacturing a nitride semiconductor light-emitting element by which a surface of a p-type contact layer can be flattened.

To achieve the object described above, the invention provides a method for manufacturing a nitride semiconductor light-emitting element, comprising:
   growing an n-type semiconductor layer on a substrate;
   growing an active layer on the n-type semiconductor layer;
   growing a p-type cladding layer with an average Al composition ratio in a thickness direction of not less than 70% on the active layer; and
   growing a p-type contact layer with an Al composition ratio of not more than 10% on the p-type cladding layer,
   wherein where a ratio $F_p/F_{III}$ of a flow rate $F_p$ of a p-type impurity source gas [µmol/min] to a flow rate $F_{III}$ of a group III element source gas [µmol/min] is defined as a p/III ratio and a ratio $F_V/F_{III}$ of a flow rate $F_V$ of a group V element source gas [µmol/min] to the flow rate $F_{III}$ is defined as a V/III ratio in each of the growing the p-type cladding layer and the growing the p-type contact layer,
   the p-type cladding layer is grown in the growing the p-type cladding layer at a growth rate of not more than 2.5 nm/min, the p/III ratio of not less than 0.0002 and not more than 0.0400 and the V/III ratio of not more than 7000, and
   the p-type contact layer is grown in the growing the p-type contact layer at a growth rate of not more than 3.3 nm/min, the p/III ratio of not less than 0.0200 and the V/III ratio of not less than 10000.

To achieve the object described above, the invention also provides a method for manufacturing a nitride semiconductor light-emitting element, comprising:
   growing an n-type semiconductor layer on a substrate;
   growing an active layer on the n-type semiconductor layer;
   growing a p-type cladding layer with an Al composition ratio of less than 70% on the active layer; and
   growing a p-type contact layer with an Al composition ratio of not more than 10% on the p-type cladding layer,
   wherein where a ratio $F_p/F_{III}$ of a flow rate $F_p$ of a p-type impurity source gas [µmol/min] to a flow rate $F_{III}$ of a group III element source gas [µmol/min] is defined as a p/III ratio and a ratio $F_V/F_{III}$ of a flow rate $F_V$ of a group V element source gas [µmol/min] to the flow rate $F_{III}$ is defined as a V/III ratio in each of the growing the p-type cladding layer and the growing the p-type contact layer,
   the p-type cladding layer is grown in the growing the p-type cladding layer at a growth rate of not more than 3.5 nm/min, the p/III ratio of not less than 0.0002 and not more than 0.0500 and the V/III ratio of not more than 6000, and
   the p-type contact layer is grown in the growing the p-type contact layer at a growth rate of not more than 6.5 nm/min, the p/III ratio of not less than 0.0100 and the V/III ratio of not less than 3000.

ADVANTAGEOUS EFFECTS OF INVENTION

According to the invention, it is possible to provide a method for manufacturing a nitride semiconductor light-emitting element by which a surface of a p-type contact layer can be flattened.

BRIEF DESCRIPTION OF DRAWINGS

FIG. 1 is a schematic diagram illustrating a nitride semiconductor light-emitting element manufactured in the first embodiment.

DESCRIPTION OF EMBODIMENTS

First Embodiment

The first embodiment of the invention will be described in reference to the FIG. 1. The embodiment below is described as a preferred illustrative example for implementing the invention. Although some part of the embodiment specifically illustrates various technically preferable matters, the technical scope of the invention is not limited to such specific aspects.

(Nitride Semiconductor Light-Emitting Element 1)

The first embodiment relates to a method for manufacturing a nitride semiconductor light-emitting device 1 (hereinafter, also simply referred to as "the light-emitting element 1") that includes a p-type cladding layer 7 with an average Al composition ratio of not less than 70%. The average Al composition ratio of the p-type cladding layer 7 is the average value of the Al composition ratios at various positions of the p-type cladding layer 7 in a thickness direction. Firstly, the light-emitting element 1 manufactured by the manufacturing method in the first embodiment will be described. FIG. 1 is a schematic diagram illustrating the light-emitting element 1 in the first embodiment. A scale ratio of each constituent element shown in FIG. 1 is not necessarily the same as the actual scale ratio of the light-emitting element 1.

The light-emitting element 1 constitutes, e.g., a light-emitting diode (LED) or a semiconductor laser (LD: laser diode). In the first embodiment, the light-emitting element 1 constitutes a light-emitting diode that emits light with a wavelength in an ultraviolet region. Particularly, the light-emitting element 1 in the first embodiment constitutes a deep ultraviolet LED that emits deep ultraviolet light at a central wavelength of not less than 200 nm and not more than 365 nm. The light-emitting element 1 in the first embodiment can be used in fields such as, e.g., sterilization (e.g., air purification, water purification, etc.), medical treatment (e.g., light therapy, measurement/analysis, etc.), UV curing, etc.

The light-emitting element 1 includes a buffer layer 3, an n-type cladding layer 4, an active layer 5, an electron blocking layer 6, the p-type cladding layer 7, and a p-type contact layer 8 in this order on a substrate 2. The light-emitting element 1 also includes an n-side electrode 11 provided on the n-type cladding layer 4, and a p-side electrode 12 provided on the p-type contact layer 8.

Hereinafter, a direction of stacking the substrate 2, the buffer layer 3, the n-type cladding layer 4, the active layer 5, the electron blocking layer 6, the p-type cladding layer 7, and the p-type contact layer 8 (an up-and-down direction in FIG. 1) is referred to as "the up-and-down". In addition, one side of the substrate 2 where each layer of the light-emitting element 1 is stacked (i.e., an upper side in FIG. 1) is referred to as the upper side, and the opposite side (i.e., a lower side in FIG. 1) is referred to as the lower side. In this regard, the terms "upper" and "lower" are used for descriptive purposes and do not limit the posture of the light-emitting element 1 with respect to the vertical direction when, e.g., the light-emitting element 1 is in use. Each layer constituting the light-emitting element 1 has a thickness in the up-and-down direction.

As semiconductors constituting the light-emitting element 1, it is possible to use, e.g., binary to quaternary group III nitride semiconductors expressed by $Al_xGa_yIn_{1-x-y}N$ (0≤x≤1, 0≤y≤1, 0≤x+y≤1). In deep ultraviolet LEDs, aluminum gallium nitride (AlGaN)-based semiconductors not including indium are often used. The group III elements in semiconductors constituting the light-emitting element 1 may be partially substituted with boron (B) or thallium (Tl), etc. In addition, nitrogen (N) may be partially substituted with phosphorus (P), arsenic (As), antimony (Sb) or bismuth (Bi), etc.

The substrate 2 is made of a material transparent to light (deep ultraviolet light in the first embodiment) emitted by the active layer 5. In the first embodiment, the substrate 2 is a sapphire ($Al_2O_3$) substrate. Alternatively, e.g., an aluminum nitride (AlN) substrate or an aluminum gallium nitride substrate, etc., may be used as the substrate 2.

The buffer layer 3 is formed on the substrate 2. In the first embodiment, the buffer layer 3 is made of aluminum nitride. When the substrate 2 is an aluminum nitride substrate or an aluminum gallium nitride substrate, the buffer layer 3 may not be necessarily included.

The n-type cladding layer 4 is formed on the buffer layer 3. The n-type cladding layer 4 is an n-type semiconductor layer made of $Al_aGa_{1-a}N$ (0≤a≤1) doped with silicon (Si) as an n-type impurity. Alternatively, germanium (Ge), selenium (Se) or tellurium (Te), etc., may be used as the n-type impurity doped into the n-type cladding layer 4. The same applies to the semiconductor layers containing an n-type impurity other than the n-type cladding layer 4. An Al composition ratio a of the n-type cladding layer 4 is, e.g., preferably not less than 20%, and is more preferably not less than 25% and not more than 70%. In this regard, the Al composition ratio is also called AlN mole fraction. A film thickness of the n-type cladding layer 4 can be, e.g., not less than 1 µm and not more than 4 µm. The n-type cladding layer 4 has a single layer structure in the first embodiment but may have a multilayer structure.

The active layer 5 is formed on the n-type cladding layer 4. The active layer 5 is formed to have a multiple quantum well structure which includes plural well layers 53. The active layer 5 generates light at a predetermined wavelength by recombination of electrons with holes in the multiple quantum well structure. In the first embodiment, the active layer 5 is configured to have a band gap of not less than 3.4 eV so that deep ultraviolet light at a wavelength of not more than 365 nm is output. Particularly in the first embodiment, the active layer 5 is configured so that deep ultraviolet light at a central wavelength of not less than 200 nm and not more than 365 nm, preferably not less than 260 nm and not more than 300 nm, can be generated.

The active layer 5 has a composition gradient barrier layer 51 on the n-type cladding layer 4, and three barrier layers 52 and three well layers 53 on the composition gradient barrier layer 51. The composition gradient barrier layer 51 is made of $Al_bGa_{1-b}N$ (0<b≤1). In the composition gradient barrier layer 51, an Al composition ratio b at each position in the up-and-down direction is higher at an upper position. The composition gradient barrier layer 51 may have a very small region in the up-and-down direction (e.g., a region of not more than 5% of the entire composition gradient barrier layer 51 in the up-and-down direction) in which the Al composition ratio b does not increase toward the upper side. The composition gradient barrier layer 51 is preferably configured such that the Al composition ratio at its lower end portion is substantially the same (e.g., a difference within 5%) as the Al composition ratio a of the n-type cladding layer 4 and the Al composition ratio at its upper end portion is substantially the same (e.g., a difference within 5%) as an Al composition ratio of the barrier layer 52 adjacent to the composition gradient barrier layer 51. A film thickness of the composition gradient barrier layer 51 can be, e.g., not less than 5 nm and not more than 20 nm. Silicon as an n-type impurity may be contained in the composition gradient barrier layer 51. In this regard, the composition gradient barrier layer 51 may not be necessarily included.

The barrier layers 52 and the well layers 53 are alternately stacked. In the active layer 5, the barrier layer 52 is formed at a position adjacent to the composition gradient barrier layer 51 on the upper side and the well layer 53 is formed at an upper end of the active layer 5.

Each barrier layer 52 is made of $Al_cGa_{1-c}N$ (0<c≤1). An Al composition ratio c of each barrier layer 52 can be, e.g., not less than 75% and not more than 95%. A film thickness of each barrier layer 52 can be, e.g., not less than 2 nm and not more than 50 nm.

Each well layer 53 is made of $Al_dGa_{1-d}N$ (0≤d<1). An Al composition ratio of each well layer 53 is smaller than the Al composition ratio of each barrier layer 52. The three well layers 53 in the first embodiment are configured such that a lowermost well layer 54, which is the well layer 53 arranged on the lowermost side, has a different configuration from two upper-side well layers 55 which are two well layers 53 other than the lowermost well layer 54.

A film thickness of the lowermost well layer 54 is larger than a film thickness of each of the upper-side well layers 55. This allows the lowermost well layer 54 to be flattened and flatness of each layer formed on the lowermost well layer 54 in the active layer 5 is thus also improved, resulting in improved monochromaticity of output light. For example, the film thickness of the lowermost well layer 54 can be not less than 4 nm and not more than 6 nm and the film thickness of each upper-side well layer 55 can be not less than 2 nm and not more than 4 nm. In addition, an Al composition ratio of the lowermost well layer 54 is higher than an Al composition ratio of each of the two upper-side well layers 55. This allows a difference in the Al composition ratio between the n-type cladding layer 4 and the lowermost well layer 54 to be relatively small, and crystallinity of each layer of the active layer 5 is improved. As a result, carrier mobility in the active layer 5 is improved and light output is improved. For example, the Al composition ratio of the lowermost well layer 54 can be not less than 35% and not more than 55%, and the Al composition ratio of each upper-side well layer 55 can be not less than 25% and not more than 45%.

In addition, the lowermost well layer 54 may be doped with silicon as an n-type impurity. In this case, formation of V-pits in the active layer 5 is induced and such V-pits serve to stop advance of dislocations from the n-type cladding layer 4 side. In this regard, the upper-side well layers 55 may also contain an n-type impurity such as silicon. In addition, the active layer 5 has a multiple quantum well structure having plural well layers 53 in the first embodiment but may have a single quantum well structure having only one well layer 53.

The electron blocking layer 6 serves to improve efficiency of electron injection into the active layer 5 by suppressing occurrence of the overflow phenomenon in which electrons leak from the active layer 5 to the p-type semiconductor layer side (hereinafter, also referred to as the electron blocking effect). The electron blocking layer 6 has a stacked structure in which a first layer 61 and a second layer 62 are stacked in this order from the lower side.

The first layer 61 is provided on the active layer 5. The first layer 61 is made of, e.g., $Al_eGa_{1-e}N$ (0<e≤1). An Al composition ratio e of the first layer 61 can be, e.g., not less than 90% and not more than 100%. A film thickness of the first layer 61 can be, e.g., not less than 0.5 nm and not more than 5.0 nm.

The second layer 62 is made of, e.g., $Al_fGa_{1-f}N$ (0<f<1). An Al composition ratio f of the second layer 62 is smaller than the Al composition ratio e of the first layer 61 and can be, e.g., not less than 70% and not more than 90%. A film thickness of the second layer 62 is larger than the film thickness of the first layer 61 and can be, e.g., not less than 15 nm and not more than 100 nm.

Each of the first layer 61 and the second layer 62 is formed without using any p-type impurity source gas. That is, each of the first layer 61 and the second layer 62 is composed of an n-type semiconductor layer or an undoped semiconductor layer. In this regard, the n-type semiconductor layer and the undoped semiconductor layer are layers formed without using any p-type impurity source gas but could contain trace amounts of p-type impurities that are inevitably mixed. When the Al composition ratio of the p-type cladding layer 7 is not less than 70%, the electron blocking layer 6 is preferably composed of only the first layer 61. This is because when the Al composition ratio of the p-type cladding layer 7 is not less than 70%, overflow of electrons can be controlled without providing the second layer 62 in the electron blocking layer 6. On the other hand, when the Al composition ratio of the p-type cladding layer 7 is less than 70%, the electron blocking layer 6 preferably includes the first layer 61 and the second layer 62. In this regard, the electron blocking layer 6 may not be necessarily included.

The p-type cladding layer 7 is formed on the second layer 62. The p-type cladding layer 7 is made of $Al_gGa_{1-g}N$ (0.7≤g≤1) doped with magnesium (Mg) as a p-type impurity. Zinc (Zn), beryllium (Be), calcium (Ca), strontium (Sr), barium (Ba) or carbon (C), etc., may be alternatively used as the p-type impurity doped into the p-type cladding layer 7. The same applies to the semiconductor layers containing a p-type impurity other than the p-type cladding layer 7. The average Al composition ratio of the p-type cladding layer 7 is not less than 70%. From the viewpoint of reducing an electrical resistance value of the light-emitting element 1, the average Al composition ratio of the p-type cladding layer 7 is preferably not more than 90%. The average Al composition ratio of the p-type cladding layer 7 is also preferably not less than 35% higher than an average Al composition ratio of each well layer 53. The higher the Al composition ratio of the well layer 53, the shorter the wavelength of deep ultraviolet light emitted from the active layer 5, while the higher the Al composition ratio of the p-type cladding layer 7, the higher the transmittance of short-wavelength deep ultraviolet light, hence, it is preferable to increase the Al composition ratio of the p-type cladding layer 7 according to the Al composition ratio of the well layer 53. A film thickness of the p-type cladding layer 7 can be, e.g., not less than 20 nm and not more than 40 nm.

The p-type cladding layer 7 is a single layer in the first embodiment but may be composed of plural layers. The average Al composition ratio of the p-type cladding layer 7 of not less than 70% in this case means that the average Al composition ratio of each of the multiple layers constituting the p-type cladding layer 7 is not less than 70%. In addition, the p-type cladding layer 7 may include, e.g., a composition gradient layer in which the Al composition ratio decreases toward the upper side.

The p-type contact layer 8 is a layer connected to the p-side electrode 12 and is made of $Al_hGa_{1-h}N$ (0≤h≤0.1) doped with magnesium as a p-type impurity. An Al composition ratio h of the p-type contact layer 8 is not more than 10%. That is, the Al composition ratio h of the p-type contact layer 8 at each position in the up-and-down direction is not more than 10%. The p-type contact layer 8 is configured to have as low Al composition ratio h as possible to achieve an ohmic contact with the p-side electrode 12. From such a viewpoint, the p-type contact layer 8 is preferably made of p-type gallium nitride (GaN) (i.e., the Al composition ratio h of 0). The p-type contact layer 8 is a layer with the Al composition ratio h of not more than 10%, and thus tends to absorb deep ultraviolet light. For this reason, a film thickness of the p-type contact layer 8 is preferably not more than 40 nm, more preferably not more than 25 nm, from the viewpoint of suppressing deep ultraviolet light absorption by the p-type contact layer 8. Here, if the film thickness of the p-type contact layer 8 is reduced excessively, the p-type contact layer 8 with a non-uniform thickness is formed on the p-type cladding layer 7 and light emission characteristics of the light-emitting element 1 may be different depending on the position on the wafer, resulting in a decrease in yield. Therefore, the film thickness of the p-type contact layer 8 is preferably not less than 3 nm.

The n-side electrode 11 is formed on a surface of the n-type cladding layer 4 which is exposed on the upper side. The n-side electrode 11 can be made of, e.g., a multilayered film formed by sequentially stacking titanium (Ti), aluminum, titanium and gold (Au) on the n-type cladding layer 4.

The p-side electrode 12 is formed on the p-type contact layer 8. The p-side electrode 12 is a reflective electrode that can reflect deep ultraviolet light emitted from the active later 5. The p-side electrode 12 has a reflectance of not less than 50% at the central wavelength of light emitted by the active later 5. The p-side electrode 12 can be composed of, e.g., a single-layered, or multi-layered, metal film containing rhodium (Rh) or aluminum.

In the first embodiment, the light-emitting element 1 is flip-chip mounted on a package substrate (not shown). That is, the light-emitting element 1 is mounted such that a side in the up-and-down direction, which is a side where the n-side electrode 11 and the p-side electrode 12 are provided, faces the package substrate and each of the n-side electrode 11 and the p-side electrode 12 is attached to the package substrate via a gold bump, etc. Light from the flip-chip mounted light-emitting element 1 is extracted on the substrate 2 side (i.e., on the lower side). In addition, in the first embodiment, since the p-side electrode 12 is a reflective electrode as described above, light once emitted from the active layer 5 toward the upper side is also extracted on the substrate 2 side by being reflected at the p-side electrode 12. However, it is not limited thereto and the light-emitting element 1 may be mounted on the package substrate by wire bonding, etc. In addition, although the light-emitting element 1 in the first embodiment is a so-called lateral light-emitting element 1 in which both the n-side electrode 11 and the p-side electrode 12 are provided on the upper side of the light-emitting element 1, the light-emitting element 1 is not limited thereto and may be a vertical light-emitting element 1. The vertical light-emitting element 1 is a light-emitting element 1 in which the active layer 5 is sandwiched between the n-side electrode 11 and the p-side electrode 12. In this regard, when the light-emitting element 1 is of the vertical type, the substrate 2 and the buffer layer 3 are preferably removed by laser lift-off, etc.

(Method for Manufacturing Light-Emitting Element 1)

Next, a method for manufacturing the light-emitting element 1 in the first embodiment will be described.

In the first embodiment, the buffer layer 3, the n-type cladding layer 4, the active layer 5, the electron blocking layer 6, the p-type cladding layer 7 and the p-type contact layer 8 are epitaxially grown on the substrate 2 in this order by the Metal Organic Chemical Vapor Deposition (MOCVD) method. The MOCVD method is sometimes called the Metal Organic Vapor Phase Epitaxy (MOVPE) method. When manufacturing the light-emitting element 1, the substrate 2 is placed on a susceptor in a chamber (not shown), and each semiconductor layer is grown on the substrate 2 by introducing source gases into the chamber while rotating the susceptor. As the source gases to epitaxially grow each semiconductor layer, it is possible to use trimethylaluminum (TMA) as an aluminum source, trimethylgallium (TMG) as a gallium source, ammonia ($NH_3$) as a nitrogen source, tetramethylsilane (TMSi) as a silicon source, and biscyclopentadienylmagnesium ($Cp_2Mg$) as a magnesium source.

The conditions for forming the p-type cladding layer 7 and the p-type contact layer 8, under which the surface of the p-type contact layer 8 can be flattened, differ depending on the Al composition ratio of the p-type cladding layer 7. The conditions for forming the p-type cladding layer 7 and the p-type contact layer 8, under which the surface of the p-type contact layer 8 can be flattened when the average Al composition ratio of the p-type cladding layer 7 is not less than 70%, are adopted in the first embodiment, and this will be described below.

Here, in each of a step of forming the p-type cladding layer 7 and a step of forming the p-type contact layer 8, a ratio $F_p/F_{III}$ of a flow rate $F_p$ of a p-type impurity source gas [μmol/min] to a flow rate $F_{III}$ of a group III element source gas [μmol/min] is defined as a p/III ratio and a ratio $F_V/F_{III}$ of a flow rate $F_V$ of a group V element source gas [μmol/min] to the flow rate $F_{III}$ is defined as a V/III ratio.

(Step of Growing P-Type Cladding Layer 7)

In the step of growing the p-type cladding layer 7, the p-type cladding layer 7 is grown at a growth rate of not more than 2.5 nm/min. The growth rate of the p-type cladding layer 7 is a rate at which the p-type cladding layer 7 grows in the up-and-down direction per minute. The p-type cladding layer 7 is a single layer in the first embodiment, but when the p-type cladding layer 7 is composed of plural layers, the growth rate of each layer constituting the p-type cladding layer 7 should satisfy not more than 2.5 nm/min. The slower the growth rate of the p-type cladding layer 7, the flatter the surface of the p-type contact layer 8. In particular, when the Al composition ratio of the p-type cladding layer 7 is not less than 70%, it is not possible to flatten the surface of the p-type contact layer 8 unless the growth rate of the p-type cladding layer is relatively slower than when the Al composition ratio of the p-type cladding layer 7 is less than 70%. That is, when the average Al composition ratio of the p-type cladding layer 7 is not less than 70% as in the first embodiment, the surface of the p-type contact layer 8 can be flattened by setting the growth rate of the p-type cladding layer 7 to a maximum of 2.5 nm/min. From the same point of view, the upper limit of the growth rate of the p-type cladding layer 7 is more preferably 2.2 nm/min. Meanwhile, from the viewpoint of productivity of the light-emitting element 1, the growth rate of the p-type cladding layer 7 is preferably not less than 0.2 nm/min.

In addition, in the step of growing the p-type cladding layer 7, the p-type cladding layer 7 is grown at the p/III ratio of not less than 0.0002 and not more than 0.0400. The p/III ratio in the step of growing the p-type cladding layer 7 is a ratio of a flow rate of $Cp_2Mg$ [μmol/min] to a sum of flow rates of trimethylaluminum and trimethylgallium [μmol/min]. In this regard, when the p/III ratio changes during the course of growing the p-type cladding layer 7, the p/III ratio should satisfy not less than 0.0002 and not more than 0.0400 during the step of growing the p-type cladding layer 7. By setting the p/III ratio in the step of growing the p-type cladding layer 7 to not less than 0.0002, it is easier to ensure that the p-type cladding layer 7 has a hole concentration, and light output is improved. Meanwhile, by setting the p/III ratio in the step of growing the p-type cladding layer 7 to not more than 0.0400, it is possible to suppress degradation in crystallinity of the p-type cladding layer 7 and to improve hole mobility in the p-type cladding layer 7, resulting in improved light output. From the viewpoint of improving light output, the p/III ratio in the step of growing the p-type cladding layer 7 is preferably not less than 0.0005 and not more than 0.0015.

Furthermore, in the step of growing the p-type cladding layer 7, the p-type cladding layer 7 is grown at the V/III ratio of not more than 7000. The V/III ratio in the step of growing the p-type cladding layer 7 is a ratio of a flow rate of ammonia [μmol/min] to the sum of the flow rates of trimethylaluminum and trimethylgallium [μmol/min]. In this regard, when the V/III ratio changes during the course of growing the p-type cladding layer 7, the V/III ratio should satisfy not more than 7000 during the step of growing the p-type cladding layer 7. If the V/III ratio is excessively increased in the step of growing the p-type cladding layer 7, a proportion of gas not contributing to the growth of the p-type cladding layer 7 in the group V element source gas supplied in the step of growing the p-type cladding layer 7 increases. Thus, the V/III ratio in the step of growing the p-type cladding layer 7 is set to not more than 7000 so that a decrease in yield can be suppressed. The V/III ratio in the step of growing the p-type cladding layer 7 is more preferably not less than 2000 and not more than 6500. By setting the V/III ratio to not less than 2000, it is possible to improve conductivity of the p-type cladding layer 7. On the other hand, when the V/III ratio is less than 2000, the ammonia supplied in the step of growing the p-type cladding layer 7 cannot fill all the N sites and portions with no N atoms are likely to remain in the p-type cladding layer 7 to be formed. If a film is further formed on the p-type cladding layer 7 having portions with no N atoms, there is a possibility that the portions with no N atoms cause pits, leakage, etc., originated from the pits occurs when the light-emitting element 1 is energized, and light output of the light-emitting element 1 decreases. Meanwhile, by setting the V/III ratio to not more than 6500, it is possible to further suppress a decrease in yield.

Other conditions can be appropriately adjusted to obtain the light-emitting element 1 with desired performance. As an example, a growth temperature of the p-type cladding layer 7 can be, e.g., not less than 1000° C. and not more than 1100° C.

(Step of Growing P-Type Contact Layer 8)

In the step of growing the p-type contact layer 8, the p-type contact layer 8 is grown at a growth rate of not more than 3.3 nm/min. The growth rate of the p-type contact layer 8 is a rate at which the p-type contact layer 8 grows in the up-and-down direction per minute. When the Al composition ratio of the p-type cladding layer 7 is not less than 70% as in the first embodiment, the surface of the p-type contact layer 8 can be flattened by setting the growth rate of the p-type contact layer 8 to not more than 3.3 nm/min. In addition, from the viewpoint of further flattening the surface of the p-type contact layer 8, the growth rate of the p-type contact layer 8 is more preferably not more than 1.6 nm/min. Meanwhile, from the viewpoint of productivity of the light-emitting element 1, the growth rate of the p-type contact layer 8 is preferably not less than 0.2 nm/min.

In addition, in the step of growing the p-type contact layer 8, the p-type contact layer 8 is grown at the p/III ratio of not less than 0.0200. The p/III ratio in the step of growing the p-type contact layer 8 is a ratio of the flow rate of $Cp_2Mg$ [μmol/min] to the flow rate of trimethylgallium [μmol/min]. By setting the p/III ratio in the step of growing the p-type contact layer 8 to not less than 0.0200, it is easier to ensure that the p-type contact layer 8 has a hole concentration, and light output is improved. From the same point of view, the p/III ratio in the step of growing the p-type contact layer 8 is preferably not less than 15 times the p/III ratio in the step of growing the p-type cladding layer 7. This is because the p-type contact layer 8 requires more holes than the p-type cladding layer 7 to have electrical contact with the p-side electrode 12. Meanwhile, from the viewpoint of improving crystallinity of the p-type contact layer 8 and also improving hole mobility in the p-type contact layer 8, the p/III ratio in the step of growing the p-type contact layer 8 is preferably not more than 0.5.

Furthermore, in the step of growing the p-type contact layer 8, the p-type contact layer 8 is grown at the V/III ratio of not less than 10000. The V/III ratio in the step of growing the p-type contact layer 8 is a ratio of the flow rate of ammonia [μmol/min] to the sum of the flow rates of trimethylaluminum and trimethylgallium [μmol/min]. By setting the V/III ratio in the step of growing the p-type contact layer 8 to not less than 10000, it is possible to improve conductivity of the p-type contact layer 8. The reason for this is presumed to be that by setting the V/III ratio in the step of growing the p-type contact layer 8 to not less than 10000, p-type impurities are more likely to enter the group III sites and holes are more likely to be formed. From the same point of view, the V/III ratio in the step of growing the p-type contact layer 8 is preferably not less than twice the V/III ratio in the step of growing the p-type cladding layer 7. In this case, it is presumed that the growth of the p-type contact layer 8 in a plane direction perpendicular to the up-and-down direction is promoted, the surface of the p-type contact layer 8 becomes flat, and this further facilitates electrical contact between the p-type contact layer 8 and the p-side electrode 12. Here, if the V/III ratio is excessively increased in the step of growing the p-type contact layer 8, a proportion of gas not contributing to the growth of the p-type contact layer 8 in the group V element source gas supplied in the step of the p-type contact layer 8 increases. Thus, from the viewpoint of suppressing a decrease in yield, the V/III ratio in the step of growing the p-type contact layer 8 is preferably not more than 100000.

Other conditions can be appropriately adjusted to obtain the light-emitting element 1 with desired performance. As an example, a growth temperature of the p-type contact layer 8 can be, e.g., not less than 900° C. and not more than 1100° C.

To epitaxially grow the semiconductor layers on the substrate 2, it is also possible to use another epitaxial growth method such as the Molecular Beam Epitaxy (MBE) method or the Hydride Vapor Phase Epitaxy (HVPE) method, etc.

Second Embodiment

The second embodiment relates to a method for manufacturing the light-emitting device 1 that includes the p-type cladding layer 7 with the average Al composition ratio of less than 70%. Firstly, the light-emitting element 1 manufactured by the manufacturing method in the second embodiment will be described.

(Light-Emitting Element 1)

In the second embodiment, a configuration different from that of the first embodiment will be described. Among the reference signs used in the second embodiment, the same reference signs as those used in the already-described embodiment indicate the same constituent elements, etc., as those in the already-described embodiment, unless otherwise specified.

In the second embodiment, the average Al composition ratio of the p-type cladding layer 7 is less than 70%. Preferably, the average Al composition ratio of the p-type cladding layer 7 is not less than 40% and not more than 65%. Overflow of electrons can be suppressed by setting the average Al composition ratio of the p-type cladding layer 7 to not less than 40%, and the electrical resistance value of the light-emitting element 1 can be reduced by setting the average Al composition ratio of the p-type cladding layer 7 to not more than 65%. Then, the average Al composition ratio of each well layer 53 is preferably less than 35% of the average Al composition ratio of the p-type cladding layer 7. When the p-type cladding layer 7 has a relatively small average Al composition ratio of less than 70%, shorter-wavelengths of deep ultraviolet light are likely to be absorbed in the p-type cladding layer 7. Thus, by setting the average Al composition ratio of the well layer 53 to be less than 35% of the average Al composition ratio of the p-type cladding layer 7, the wavelength of the deep ultraviolet light emitted from the active layer 5 can be lengthened and absorption of short-wavelength deep ultraviolet light by the p-type cladding layer 7 can be suppressed.

The other configurations of the light-emitting element 1 manufactured by the manufacturing method in the second embodiment are the same as those of the light-emitting element manufactured by the manufacturing method in the first embodiment.

(Method for Manufacturing Light-Emitting Element 1)

Next, the method for manufacturing the light-emitting element 1 in the second embodiment will be described. In the second embodiment, the step of growing the p-type cladding layer 7 and the step of growing the p-type contact layer 8 are different from those in the first embodiment. Thus, these steps will be descried below.

(Step of Growing P-Type Cladding Layer 7)

In the step of growing the p-type cladding layer 7, the p-type cladding layer 7 is grown at the growth rate of not more than 3.5 nm/min. In particular, when the average Al composition ratio of the p-type cladding layer 7 is less than 70%, the surface of the p-type contact layer 8 can be flattened even if the growth rate is relatively faster than when the average Al composition ratio of the p-type cladding layer 7 is not less than 70%. In other words, when the average Al composition ratio of the p-type cladding layer 7 is less than 70%, the surface of the p-type contact layer 8 can be flattened even if the upper limit of the growth rate of the p-type cladding layer 7 is increased to 3.5 nm/min. From the same point of view, the upper limit of the growth rate of the p-type cladding layer 7 is more preferably 3.4 nm/min. Meanwhile, from the viewpoint of productivity of the light-emitting element 1, the growth rate of the p-type cladding layer 7 is preferably not less than 0.2 nm/min.

In addition, in the step of growing the p-type cladding layer 7, the p-type cladding layer 7 is grown at the p/III ratio of not less than 0.0002 and not more than 0.0500, preferably not less than 0.0005 and not more than 0.0020, in the similar manner to the first embodiment.

Furthermore, in the step of growing the p-type cladding layer 7, the p-type cladding layer 7 is grown at the V/III ratio of not more than 6000. A decrease in yield due to excessive supply of the group V element source gases in the step of growing the p-type cladding layer 7 can be thereby suppressed. Here, the larger the V/III ratio in the step of growing the p-type cladding layer 7, the more the growth of the p-type cladding layer 7 in the plane direction perpendicular to the up-and-down direction is promoted and flatness of the p-type cladding layer 7 is ensured. Meanwhile, the lower the Al composition ratio of the p-type cladding layer 7, the easier it is to ensure the flatness of the p-type cladding layer 7. Therefore, in the second embodiment in which the Al composition ratio of the p-type cladding layer 7 is relatively low, the flatness of the p-type cladding layer 7 can be ensured even if the V/III ratio in the step of growing the p-type cladding layer 7 is less than 6000. The V/III ratio in the step of growing the p-type cladding layer 7 is more preferably not less than 2000 and not more than 4500. By setting the V/III ratio to not less than 2000, it is possible to improve conductivity of the p-type cladding layer 7. On the other hand, when the V/III ratio is less than 2000, the ammonia supplied in the step of growing the p-type cladding layer 7 cannot fill all the N sites and portions with no N atoms are likely to remain in the p-type cladding layer 7 to be formed. If a film is further formed on the p-type cladding layer 7 having portions with no N atoms, there is a possibility that the portions with no N atoms cause pits, leakage, etc., originated from the pits occurs when the light-emitting element 1 is energized, and light output of the light-emitting element 1 decreases. Meanwhile, by setting the V/III ratio to not more than 4500, it is possible to further suppress a decrease in yield.

(Step of Growing P-Type Contact Layer 8)

In the step of growing the p-type contact layer 8, the p-type contact layer 8 is grown at the growth rate of not more than 6.5 nm/min. When the average Al composition ratio of the p-type cladding layer 7 is less than 70% as in the second embodiment, the surface of the p-type contact layer 8 can be flattened even if the upper limit of the growth rate of the p-type contact layer 8 is increased to 6.5 nm/min. In addition, from the viewpoint of further flattening the surface of the p-type contact layer 8, the growth rate of the p-type contact layer 8 is more preferably not more than 3.3 nm/min. Meanwhile, from the viewpoint of productivity of the light-emitting element 1, the growth rate of the p-type contact layer 8 is not less than 0.2 nm/min.

In addition, in the step of growing the p-type contact layer 8, the p-type contact layer 8 is grown at the p/III ratio of not less than 0.0100. This makes it easier to ensure that the p-type contact layer 8 has a hole concentration, and light output is improved. Here, the larger the p/III ratio in the step of growing the p-type contact layer 8, the more the growth of the p-type contact layer 8 in the plane direction perpendicular to the up-and-down direction is promoted and flatness of the p-type contact layer 8 is ensured. Meanwhile, the lower the Al composition ratio of the p-type cladding layer 7, the easier it is to ensure the flatness of the p-type contact layer 8. Therefore, in the second embodiment in which the Al composition ratio of the p-type cladding layer 7 is relatively low, the flatness of the p-type contact layer 8 can be ensured even if the lower limit of the p/III ratio in the step of growing the p-type contact layer 8 is as small as 0.0100. In addition, from the viewpoint of ensuring that the p-type contact layer 8 has a hole concentration, the p/III ratio in the step of growing the p-type contact layer 8 is preferably not less than 10 times the p/III ratio in the step of growing the p-type cladding layer 7. This is because the p-type contact layer 8 requires more holes than the p-type cladding layer 7 to have electrical contact with the p-side electrode 12. In addition, in the second embodiment in which the Al composition ratio of the p-type cladding layer 7 is relatively low, the p/III ratio in the step of growing the p-type contact layer 8 is preferably not less than 10 times the p/III ratio in the step of growing the p-type cladding layer 7 as described above in consideration of the fact that the p-type cladding layer 7 is doped with a large amount of p-type impurity. Meanwhile, from the viewpoint of improving crystallinity of the p-type contact layer 8 and also improving hole mobility in the p-type contact layer 8, the p/III ratio in the step of growing the p-type contact layer 8 is preferably not more than 0.5.

Furthermore, in the step of growing the p-type contact layer 8, the p-type contact layer 8 is grown at the V/III ratio of not less than 3000. Conductivity of the p-type contact layer 8 can thereby be improved. The reason for this is presumed to be that by setting the V/III ratio in the step of growing the p-type contact layer 8 to not less than 3000, p-type impurities are more likely to enter the group III sites and holes are more likely to be formed. From the same point of view, the V/III ratio in the step of growing the p-type contact layer 8 is preferably more than the V/III ratio in the step of growing the p-type cladding layer 7. In this case, it is presumed that the growth of the p-type contact layer 8 in the plane direction perpendicular to the up-and-down direction is promoted, the surface of the p-type contact layer 8 becomes flat, and this further facilitates electrical contact between the p-type contact layer 8 and the p-side electrode 12. In addition, the larger the V/III ratio in the step of growing the p-type contact layer 8, the more the growth of the p-type contact layer 8 in the plane direction perpendicular to the up-and-down direction is promoted and flatness of the p-type contact layer 8 is ensured. Meanwhile, the lower the Al composition ratio of the p-type cladding layer 7, the easier it is to ensure the flatness of the p-type cladding layer 7 and the p-type contact layer 8. Considering the above, in the second embodiment in which the Al composition ratio of the p-type cladding layer 7 is relatively low, the flatness of the p-type contact layer 8 can be ensured by setting the V/III ratio in the step of growing the p-type contact layer 8 to a value more than the V/III ratio in the step of growing the p-type cladding layer 7. Here, if the V/III ratio is excessively increased in the step of growing the p-type contact layer 8, a proportion of gas not contributing to the growth of the p-type contact layer 8 in the group V element source gas supplied in the step of the p-type contact layer 8 increases. Thus, from the viewpoint of suppressing a decrease in yield, the V/III ratio in the step of growing the p-type contact layer 8 is preferably not more than 100000.

EXPERIMENT EXAMPLE

This Experimental Example is an example to show that a surface of a p-type contact layer of a light-emitting element is flattened when the light-emitting element has a p-type cladding layer with the average Al composition ratio of not less than 70% and is manufactured under the manufacturing conditions of the first embodiment and when the light-emitting element has a p-type cladding layer with the average Al composition ratio of less than 70% and is manufactured under the manufacturing conditions of the second conditions.

In this Experimental Example, light-emitting elements in Examples 1 to 5 and Comparative Examples 1 to 3 were made. Examples 1 and 2 and Comparative Examples 1 and 2 are the light-emitting elements having a p-type cladding layer with an average Al composition ratio of not less than 70% in the same manner as the first embodiment. Examples 1 and 2 and Comparative Examples 1 and 2 have the same structure but are different in the conditions for forming the p-type contact layer. Examples 3 to 5 and Comparative Example 3 are the light-emitting elements having a p-type cladding layer with the average Al composition ratio of less than 70% in the same manner as the second embodiment. Examples 3 to 5 and Comparative Example 3 have the same structure but are different in the conditions for forming the p-type contact layer.

Table 1 below shows the thickness and Al composition ratio of each layer in Examples 1 and 2 and Comparative Examples 1 and 2. Table 2 below shows the thickness and Al composition ratio of each layer in Examples 3 to 5 and Comparative Example 3 which are the light-emitting elements having a p-type cladding layer with the average Al composition ratio of less than 70%. Regarding Tables 1 and 2, the thickness of each layer was measured by a transmission electron microscope, and the Al composition ratio of each layer is a value estimated from secondary ion intensity of Al measured by Secondary Ion Mass Spectrometry (SIMS).

TABLE 1

| Structure (Comparative Examples 1, 2 and Examples 1, 2) | | Thickness | Al composition ratio [%] |
|---|---|---|---|
| Sapphire substrate | | 430 ± 25 um | — |
| Buffer layer | | 2000 ± 200 nm | 100 |
| N-type cladding layer | | 2000 ± 200 nm | 55 ± 10 |
| Active layer | Composition gradient barrier layer | 15 ± 5 nm | 55→85 |
| | Barrier layer | 7 ± 5 nm | 85 ± 10 |
| | Lowermost well layer | 5 ± 1 nm | 45 ± 10 |
| | Barrier layer | 7 ± 5 nm | 85 ± 10 |
| | Upper-side well layer | 3 ± 1 nm | 35 ± 10 |
| | Barrier layer | 7 ± 5 nm | 85 ± 10 |
| | Upper-side well layer | 3 ± 1 nm | 35 ± 10 |
| Electron blocking layer | First layer | 2 ± 1 nm | 95 ± 5 |
| | Second layer | 20 ± 5 nm | 80 ± 10 |
| P-type cladding layer | | 30 ± 10 nm | 80 ± 10 |
| P-type contact layer | | 14.4-24.1 nm | 0 |

TABLE 2

| Structure (Comparative Example 3 and Examples 3 to 5) | | Thickness | Al composition ratio [%] |
|---|---|---|---|
| Sapphire substrate | | 430 ± 25 um | — |
| Buffer layer | | 2000 ± 200 nm | 100 |
| N-type cladding layer | | 2000 ± 200 nm | 55 ± 10 |
| Active layer | Composition gradient barrier layer | 15 ± 5 nm | 55→85 |
| | Barrier layer | 7 ± 5 nm | 85 ± 10 |
| | Lowermost well layer | 5 ± 1 nm | 45 ± 10 |
| | Barrier layer | 7 ± 5 nm | 85 ± 10 |
| | Upper-side well layer | 3 ± 1 nm | 35 ± 10 |
| | Barrier layer | 7 ± 5 nm | 85 ± 10 |
| | Upper-side well layer | 3 ± 1 nm | 35 ± 10 |
| Electron blocking layer | First layer | 2 ± 1 nm | 95 ± 5 |
| | Second layer | 20 ± 5 nm | 80 ± 10 |
| P-type cladding layer | | 30 ± 10 nm | 55 ± 10 |
| P-type contact layer | | 18.3-19.6 nm | 0 |

Regarding Al composition ratio of Composition gradient barrier layer in Tables 1 and 2, the numbers shown mean that the Al composition ratio of the composition gradient barrier layer in the up-and-down direction gradually increases from 55% to 85% from the lower end to the upper end of the composition gradient barrier layer. Meanwhile, regarding Thickness of P-type contact layer in Table 1, the numbers shown mean that the thickness of the p-type contact layer in each of Examples 1, 2 and Comparative Examples 1, 2 is within a range of not less than 14.4 nm and not more than 24.1 nm. Details of the thickness of the p-type contact layer in each of Examples 1, 2 and Comparative Examples 1, 2 are shown in Table 3 below. Likewise, regarding Thickness of P-type contact layer in Table 2, the numbers shown mean that the thickness of the p-type contact layer in each of Examples 3 to 5 and Comparative Example 3 satisfies not less than 18.3 nm and not more than 19.6 nm. Details of the thickness of the p-type contact layer in each of Examples 3 to 5 and Comparative Example 3 are shown in Table 3 below.

The conditions for forming the p-type cladding layer and the p-type contact layer in Examples and Comparative Examples are shown in Table 3 below. Leakage/short circuit occurrence rates (described later) in Examples and Comparative Examples are also shown in Table 3 below.

p-type contact layer, are the same as the manufacturing conditions in the second embodiment.

Then, the leakage/short circuit occurrence rate was measured on each of the light-emitting elements in Examples and Comparative Examples. The lower the surface flatness of the p-type contact layer, the lower the adhesion between the p-type contact layer and the p-side electrode and the more likely it is that leakage/short circuit occurs. Therefore, in this Experiment Example, the leakage/short circuit occurrence rate was used as an indicator of the surface condition

TABLE 3

| | P-type cladding layer | | | | P-type contact layer | | | | | Leakage/short circuit occurrence rate [%] |
|---|---|---|---|---|---|---|---|---|---|---|
| | Average Al composition ratio [%] | Growth rate [nm/min] | V/III ratio | p/III ratio | Average Al composition ratio [%] | Growth rate [nm/min] | V/III ratio | p/III ratio | Film thickness [nm] | |
| Comp. Ex. 1 | 80 | 2.15 | 5520 | 9.17E−04 | 0 | 9.59 | 3701 | 5.13E−03 | 14.4 | 39.8 |
| Comp. Ex. 2 | | | | | | 8.02 | 7403 | 1.03E−02 | 24.1 | 42.9 |
| Ex. 1 | | | | | | 3.28 | 13880 | 2.05E−02 | 19.7 | 12.1 |
| Ex. 2 | | | | | | 1.53 | 29611 | 3.85E−02 | 18.3 | 3.6 |
| Comp. Ex. 3 | 60 | 3.32 | 3255 | 5.41E−04 | 0 | 12.23 | 925 | 5.13E−03 | 18.3 | 50.6 |
| Ex. 3 | | | | | | 6.44 | 3701 | 1.03E−02 | 19.3 | 12.1 |
| Ex. 4 | | | | | | 3.27 | 13880 | 2.05E−02 | 19.6 | 3.0 |
| Ex. 5 | | | | | | 1.62 | 13880 | 3.85E−02 | 19.4 | 2.8 |

As shown in Table 3, regarding formation of the p-type contact layer in Examples 1 and 2, the conditions described in the first embodiment (i.e., the growth rate of not more than 3.3 nm/min, the p/III ratio of not less than 0.0200, and the V/III ratio of not less than 10000) are satisfied. On the other hand, regarding formation of the p-type contact layer in Comparative Examples 1 and 2, each of the growth rate, the p/III ratio and the V/III ratio does not satisfy the aforementioned conditions described in the first embodiment. Meanwhile, regarding formation of the p-type cladding layer in each of Examples 1, 2 and Comparative Examples 1, 2, the conditions described in the first embodiment (i.e., the growth rate of not more than 2.5 nm/min, the p/III ratio of not less than 0.0002 and not more than 0.0400, and the V/III ratio of not more than 7000) are satisfied. The manufacturing conditions in Examples 1, 2 and Comparative Examples 1, 2, other than the conditions for forming the p-type contact layer, are the same as the manufacturing conditions in the first embodiment.

Meanwhile, as shown in Table 3, regarding formation of the p-type contact layer in Examples 3 to 5, the conditions described in the second embodiment (i.e., the growth rate of not more than 6.5 nm/min, the p/III ratio of not less than 0.0100, and the V/III ratio of not less than 3000) are satisfied. On the other hand, regarding formation of the p-type contact layer in Comparative Example 3, each of the growth rate, the p/III ratio and the V/III ratio does not satisfy the aforementioned conditions described in the second embodiment. Meanwhile, regarding formation of the p-type cladding layer in each of Examples 3 to 5 and Comparative Example 3, the conditions described in the second embodiment (i.e., the growth rate of not more than 3.5 nm/min, the p/III ratio of not less than 0.0002 and not more than 0.0500, and the V/III ratio of not more than 6000) are satisfied. The manufacturing conditions in Examples 3 to 5 and Comparative Example 3, other than the conditions for forming the of the p-type contact layer. The lower the value of the leakage/short circuit occurrence rate, the flatter the surface of the p-type contact layer.

A method for measuring the leakage/short circuit occurrence rate of the light-emitting elements in Examples and Comparative Examples will be described. Firstly, in each of Examples and Comparative Examples, the n-side electrode was formed on the n-type cladding layer and the p-side electrode on the p-type contact layer, as described in the first embodiment. Then, forward voltage between the n-side electrode and the p-side electrode was measured, and it was determined that leakage/short circuit occurred when the forward voltage was not more than 3V. In this Experiment Example, not less than one thousand light-emitting elements were made for each of Examples 1 to 5 and Comparative Examples 1 to 3, and the leakage/short circuit occurrence rate was measured. The results are shown in Table 3.

As seen in Table 3, when the average Al composition ratio of the p-type cladding layer is not less than 70%, the leakage/short circuit occurrence rate is high in Comparative Examples 1 and 2, but the leakage/short circuit occurrence rate is low in Examples 1 and 2. This shows that the leakage/short circuit occurrence rate can be suppressed by manufacturing light-emitting elements according to the method for making the p-type cladding layer and the p-type contact layer described in the first embodiment. In addition, when the average Al composition ratio of the p-type cladding layer is not less than 70%, the leakage/short circuit occurrence rate in Example 2 is the lowest, which shows that the growth rate of the p-type contact layer is preferably less than 3.0 nm/min, more preferably not more than 1.6 nm/min.

Meanwhile, as seen in Table 3, when the average Al composition ratio of the p-type cladding layer is less than 70%, the leakage/short circuit occurrence rate is high in Comparative Example 3, but the leakage/short circuit occurrence rate is low in Examples 3 to 5. This shows that the leakage/short circuit occurrence rate can be suppressed by manufacturing light-emitting elements according to the method for making the p-type cladding layer and the p-type contact layer described in the second embodiment. In addition, when the average Al composition ratio of the p-type cladding layer is less than 70%, the leakage/short circuit occurrence rate is significantly suppressed in Examples 4 and 5, which shows that the growth rate of the p-type contact layer is preferably not less than 3.3 nm/min. In addition, the leakage/short circuit occurrence rate is more reduced in Example 4 than in Example 5, which shows that the growth rate of the p-type contact layer is preferably less than 3.0 nm/min, more preferably not more than 1.70 nm/min.

SUMMARY OF THE EMBODIMENTS

Technical ideas understood from the embodiments will be described below citing the reference signs, etc., used for the embodiments. However, each reference sign, etc., described below is not intended to limit the constituent elements in the claims to the members, etc., specifically described in the embodiments.

[1] The first aspect of the invention is a method for manufacturing a nitride semiconductor light-emitting element (1), comprising: growing an n-type semiconductor layer (4) on a substrate (2); growing an active layer (5) on the n-type semiconductor layer (4); growing a p-type cladding layer (7) with an average Al composition ratio in a thickness direction of not less than 70% on the active layer (5); and growing a p-type contact layer (8) with an Al composition ratio of not more than 10% on the p-type cladding layer (7), wherein where a ratio $F_p/F_{III}$ of a flow rate $F_p$ of a p-type impurity source gas [μmol/min] to a flow rate $F_{III}$ of a group III element source gas [μmol/min] is defined as a p/III ratio and a ratio $F_V/F_{III}$ of a flow rate $F_V$ of a group V element source gas [μmol/min] to the flow rate $F_{III}$ is defined as a V/III ratio in each of the growing the p-type cladding layer (7) and the growing the p-type contact layer (8), the p-type cladding layer (7) is grown in the growing the p-type cladding layer (7) at a growth rate of not more than 2.5 nm/min, the p/III ratio of not less than 0.0002 and not more than 0.0400 and the V/III ratio of not more than 7000, and the p-type contact layer (8) is grown in the growing the p-type contact layer (8) at a growth rate of not more than 3.3 nm/min, the p/III ratio of not less than 0.0200 and the V/III ratio of not less than 10000.

It is thereby possible to manufacture a nitride semiconductor light-emitting element (1) having a p-type contact layer with a flat surface.

[2] The second aspect of the invention is that, in the first aspect, the p-type cladding layer (7) is grown in the growing the p-type cladding layer (7) at the p/III ratio of not less than 0.0005 and not more than 0.0015.

It is thereby possible to manufacture a nitride semiconductor light-emitting element with high light output.

[3] The third aspect of the invention is that, in the first or second aspect, the p-type cladding layer (7) is grown in the growing the p-type cladding layer (7) at the V/III ratio of not less than 2000 and not more than 6500.

It is thereby possible to make a p-type cladding layer with high conductivity and also to suppress a decrease in yield.

[4] The fourth aspect of the invention is that, in any one of the first to third aspects, the p-type contact layer (8) is grown in the growing the p-type contact layer (8) at the growth rate of not more than 1.6 nm/min.

It is thereby possible to manufacture a nitride semiconductor light-emitting element having a p-type contact layer with a flatter surface.

[5] The fifth aspect of the invention is that, in any one of the first to fourth aspects, the p-type contact layer (8) is grown in the growing the p-type contact layer (8) at the p/III ratio that is not less than 15 times the p/III ratio in the growing the p-type cladding layer (7).

It is thereby possible to manufacture a nitride semiconductor light-emitting element with high light output.

[6] The sixth aspect of the invention is that, in any one of the first to fifth aspects, the p-type contact layer (8) is grown in the growing the p-type contact layer (8) at the V/III ratio that is not less than twice the V/III ratio in the growing the p-type cladding layer (7).

It is thereby possible to make a p-type cladding layer with high conductivity.

[7] The seventh aspect of the invention is a method for manufacturing a nitride semiconductor light-emitting element (1), comprising: growing an n-type semiconductor layer (4) on a substrate (2); growing an active layer (5) on the n-type semiconductor layer (4); growing a p-type cladding layer (7) with an Al composition ratio of less than 70% on the active layer (5); and growing a p-type contact layer (8) with an Al composition ratio of not more than 10% on the p-type cladding layer (7), wherein where a ratio $F_p/F_{III}$ of a flow rate $F_p$ of a p-type impurity source gas [μmol/min] to a flow rate $F_{III}$ of a group III element source gas [μmol/min] is defined as a p/III ratio and a ratio $F_V/F_{III}$ of a flow rate $F_V$ of a group V element source gas [μmol/min] to the flow rate $F_{III}$ is defined as a V/III ratio in each of the growing the p-type cladding layer (7) and the growing the p-type contact layer (8), the p-type cladding layer (7) is grown in the growing the p-type cladding layer (7) at a growth rate of not more than 3.5 nm/min, the p/III ratio of not less than 0.0002 and not more than 0.0500 and the V/III ratio of not more than 6000, and the p-type contact layer (8) is grown in the growing the p-type contact layer (8) at a growth rate of not more than 6.5 nm/min, the p/III ratio of not less than 0.0100 and the V/III ratio of not less than 3000.

It is thereby possible to manufacture a nitride semiconductor light-emitting element having a p-type contact layer with a flat surface.

[8] The eighth aspect of the invention is that, in the seventh aspect, the p-type cladding layer (7) is grown in the growing the p-type cladding layer (7) at the p/III ratio of not less than 0.0005 and not more than 0.0020.

It is thereby possible to manufacture a nitride semiconductor light-emitting element with high light output.

[9] The ninth aspect of the invention is that, in the seventh or eighth aspect, the p-type cladding layer (7) is grown in the growing the p-type cladding layer (7) at the V/III ratio of not less than 2000 and not more than 4500.

It is thereby possible to make a p-type cladding layer with high conductivity and also to suppress a decrease in yield.

[10] The tenth aspect of the invention is that, in any one of the seventh to ninth aspects, the p-type contact layer (8) is grown in the growing the p-type contact layer (8) at the growth rate of not more than 3.3 nm/min.

It is thereby possible to manufacture a nitride semiconductor light-emitting element having a p-type contact layer with a flatter surface.

[11] The eleventh aspect of the invention is that, in any one of the seventh to tenth aspects, the p-type contact layer (8) is grown in the growing the p-type contact layer (8) at the p/III ratio that is not less than 10 times the p/III ratio in the growing the p-type cladding layer (7).

It is thereby possible to manufacture a nitride semiconductor light-emitting element with high light output.

[12] The twelfth aspect of the invention is that, in any one of the seventh to eleventh aspects, the p-type contact layer (8) is grown in the growing the p-type contact layer (8) at the V/III ratio with a value that is more than the V/III ratio in the growing the p-type cladding layer (7).

It is thereby possible to make a p-type cladding layer with high conductivity.

Additional Note

Although the embodiments of the invention have been described, the invention according to claims is not to be limited to the embodiments described above. Further, please note that not all combinations of the features described in the embodiments are necessary to solve the problem of the invention. In addition, the invention can be appropriately modified and implemented without departing from the gist thereof.

REFERENCE SIGNS LIST

1 LIGHT-EMITTING ELEMENT
2 SUBSTRATE
4 N-TYPE CLADDING LAYER (N-TYPE SEMICONDUCTOR LAYER)
5 ACTIVE LAYER
7 P-TYPE CLADDING LAYER
8 P-TYPE CONTACT LAYER

The invention claimed is:

1. A method for manufacturing a nitride semiconductor light-emitting element, comprising:
    growing an n-type semiconductor layer on a substrate;
    growing an active layer on the n-type semiconductor layer;
    growing a p-type cladding layer with an average Al composition ratio in a thickness direction of not less than 70% on the active layer; and
    growing a p-type contact layer with an Al composition ratio of not more than 10% on the p-type cladding layer,
    wherein where a ratio $F_p/F_{III}$ of a flow rate $F_p$ of a p-type impurity source gas [μmol/min] to a flow rate $F_{III}$ of a group III element source gas [μmol/min] is defined as a p/III ratio and a ratio $F_V/F_{III}$ of a flow rate $F_V$ of a group V element source gas [μmol/min] to the flow rate $F_{III}$ is defined as a V/III ratio in each of in the growing the p-type cladding layer and the growing the p-type contact layer,
    the p-type cladding layer is grown in the growing the p-type cladding layer at a growth rate of not more than 2.5 nm/min, the p/III ratio of not less than 0.0002 and not more than 0.0400 and the V/III ratio of not more than 7000, and
    the p-type contact layer is grown in the growing the p-type contact layer at a growth rate of not more than 3.3 nm/min, the p/III ratio of not less than 0.0200 and the V/III ratio of not less than 10000.

2. The method according to claim 1, wherein the p-type cladding layer is grown in the growing the p-type cladding layer at the p/III ratio of not less than 0.0005 and not more than 0.0015.

3. The method according to claim 1, wherein the p-type cladding layer is grown in the growing the p-type cladding layer at the V/III ratio of not less than 2000 and not more than 6500.

4. The method according to claim 1, wherein the p-type contact layer is grown in the growing the p-type contact layer at the growth rate of not more than 1.6 nm/min.

5. The method according to claim 1, wherein the p-type contact layer is grown in the growing the p-type contact layer at the p/III ratio that is not less than 15 times the p/III ratio in the growing the p-type cladding layer.

6. The method according to claim 1, wherein the p-type contact layer is grown in the growing the p-type contact layer at the V/III ratio that is not less than twice the V/III ratio in the growing the p-type cladding layer.

7. A method for manufacturing a nitride semiconductor light-emitting element, comprising:
    growing an n-type semiconductor layer on a substrate;
    growing an active layer on the n-type semiconductor layer;
    growing a p-type cladding layer with an Al composition ratio of less than 70% on the active layer; and
    growing a p-type contact layer with an Al composition ratio of not more than 10% on the p-type cladding layer,
    wherein where a ratio $F_p/F_{III}$ of a flow rate $F_p$ of a p-type impurity source gas [μmol/min] to a flow rate $F_{III}$ of a group III element source gas [μmol/min] is defined as a p/III ratio and a ratio $F_V/F_{III}$ of a flow rate $F_V$ of a group V element source gas [μmol/min] to the flow rate $F_{III}$ is defined as a V/III ratio in each of the growing the p-type cladding layer and the growing the p-type contact layer,
    the p-type cladding layer is grown in the growing the p-type cladding layer at a growth rate of not more than 3.5 nm/min, the p/III ratio of not less than 0.0002 and not more than 0.0500 and the V/III ratio of not more than 6000, and
    the p-type contact layer is grown in the growing the p-type contact layer at a growth rate of not more than 6.5 nm/min, the p/III ratio of not less than 0.0100 and the V/III ratio of not less than 3000.

8. The method according to claim 7, wherein the p-type cladding layer is grown in the growing the p-type cladding layer at the p/III ratio of not less than 0.0005 and not more than 0.0020.

9. The method according to claim 7, wherein the p-type cladding layer is grown in the growing the p-type cladding layer at the V/III ratio of not less than 2000 and not more than 4500.

10. The method according to claim 7, wherein the p-type contact layer is grown in the growing the p-type contact layer at the growth rate of not more than 3.3 nm/min.

11. The method according to claim 7, wherein the p-type contact layer is grown in the growing the p-type contact layer at the p/III ratio that is not less than 10 times the p/III ratio in the growing the p-type cladding layer.

12. The method according to claim 7, wherein the p-type contact layer is grown in the growing the p-type contact layer at the V/III ratio with a value that is more than the V/III ratio in the growing the p-type cladding layer.

* * * * *